United States Patent [19]

Nyseth

[11] Patent Number: 5,586,658

[45] Date of Patent: Dec. 24, 1996

[54] WAFER CUSHIONS FOR WAFER SHIPPER

[75] Inventor: David L. Nyseth, Plymouth, Minn.

[73] Assignee: Fluoroware, Inc., Chaska, Minn.

[21] Appl. No.: 471,641

[22] Filed: Jun. 6, 1995

[51] Int. Cl.[6] ............................................. B65D 85/30
[52] U.S. Cl. ............................................. 206/711; 206/587
[58] Field of Search ............................................. 206/710, 711, 206/712, 445, 586, 591, 587; 211/40, 41; 118/500

[56] References Cited

U.S. PATENT DOCUMENTS

| | | |
|---|---|---|
| 4,043,451 | 8/1977 | Johnson . |
| 4,171,740 | 10/1979 | Clement et al. . |
| 4,248,346 | 2/1981 | Johnson . |
| 4,555,024 | 11/1985 | Voss et al. . |
| 4,557,382 | 12/1985 | Johnson . |
| 4,574,950 | 3/1986 | Koe et al. . |
| 4,718,549 | 1/1988 | Rissotti et al. . |
| 4,773,537 | 9/1988 | Kikuchi . |
| 4,779,732 | 10/1988 | Boehm et al. ....................... 206/711 X |
| 4,793,488 | 12/1988 | Mortensen . |
| 4,817,799 | 4/1989 | Gregerson et al. . |
| 4,966,284 | 10/1990 | Gregerson et al. . |
| 5,046,615 | 9/1991 | Nentl et al. . |
| 5,228,568 | 7/1993 | Ogino et al. ........................... 206/711 |
| 5,253,755 | 10/1993 | Maenke . |
| 5,255,797 | 10/1993 | Kos . |
| 5,273,159 | 12/1993 | Gregerson . |

*Primary Examiner*—Jacob K. Ackun
*Attorney, Agent, or Firm*—Palmatier, Sjoquist & Helget, PA

[57] ABSTRACT

A plastic container for handling, storing and shipping semiconductor wafers comprising a wafer carrier supporting the wafers and maintaining the wafers in spaced relation to each other, a plurality of rows of resiliently flexible tabs of progressively increasing and decreasing widths formed on the partially cylindrical top and bottom surfaces of the wafer carrier, the top and bottom surfaces formed of stiff but resiliently flexibly yieldable material, supporting ribs on the bottom surface extending longitudinally of the bottom and parallel to the rows thereon, the width of the tabs being shorter at the ends of the rows and wider in the middle to engage and maintain the edges of the wafers spaced from the top and bottom surfaces while allowing for flexing and bowing of the top and bottom surfaces from the pressure of the covers and weight of the wafers.

20 Claims, 5 Drawing Sheets

WAFER CUSHIONS FOR WAFER SHIPPER

BACKGROUND OF THE INVENTION

This invention relates to containers and packages for shipping semiconductor wafers and similar objects.

Semiconductor wafers are subjected to numerous steps in their processing. The wafers are subjected to various process steps in various machines and at various locations. The wafers must be transported from place to place and stored over a period of time in order to accommodate the necessary processing. Numerous types of shipping devices have been previously known for handling, storing and shipping wafers. A principal component of the shipping devices is a means for cushioning the wafer to protect against physical damage from shock and vibration. Such shipping containers and cushioning means have been previously known as disclosed in U.S. Pat. Nos. 4,043,451; 4,171,740; 4,248,346; 4,555,024; 4,574,950; 4,557,382; 4,718,549; 4,773,488; 4,817,779; 4,966,284; 5,046,617; 5,253,755; 5,255,797 and 5,273,159. These shipping devices do not provided sufficient cushioning to protect the wafers from physical damage while accommodating flexing of the shipping device due to handling procedures and the weight of the wafers.

SUMMARY OF THE INVENTION

An object of the invention is to provide a shipping container for safely storing semiconductor wafers and to minimize likelihood of wafer damage due to shock or vibration.

A feature of the invention is a wafer carrier comprising an elongate container with side and end walls. An elongate top cover defining a top wall and an elongate bottom cover defining a bottom wall. The sidewalls having wafer separating ribs. The cover has a plurality of rows of cushioning tabs on the inside surface of the cover. The rows extending longitudinally of the cover. The tabs being substantially rectangular, have a wafer engaging edge and extend into the container. Adjacent tabs separated by a slot and positioned along the cover to align with the wafers held in the carrier. The row having a discontinuous outer edge defined by wafer engaging edges of adjacent tabs along the row. The tabs being flexible and resilient to engage and cushion the wafers.

Another feature of the invention is the width of the tabs at the end of a row is shorter than tabs in the middle portion of the row. The width of adjacent tabs changes progressively from the end portion to the middle portion of each row. The wafer engaging edges of each tab and the slots that separate adjacent tabs form a discontinuous outer edge of the row which has a substantially arcuate shape.

Another feature of the invention is the positioning of the tabs on the top cover to maximize the cushioning effect on the wafers. A row of tabs located along the center of the top cover.

Another feature of the invention is the rows of tabs may be formed with the cover to minimize manufacturing costs.

Another feature of the invention is a slot formed between adjacent tabs in a row to allow each tab to engage and hold a single wafer. The slot will allow each tab to flex individually when engaging a wafer and prevent the flexing of one tab from effecting the engagement of other tabs with their respective wafers.

An additional feature of the invention is a plurality of rows of cushioning tabs in the bottom of the carrier. The rows are spaced from each other. The tabs extend into the container and have a wafer engaging edge.

Yet another feature of the invention is the width of the tabs at the end of a row is shorter than tabs in the middle portion of the row. The tabs may be formed to create an arcuate shape along the outer edge of the row.

An additional feature of the invention is that the rows of tabs in the top cover are similar in design and shape to the rows of tabs in the bottom cover. Furthermore, the arcuate shape of the outer edge along each row is similar on rows in the top cover and in the bottom cover.

A further feature of the invention is the rows of tabs in the bottom cover aligned to engage wafers with wafer engaging edges to lift the wafers off of the sidewalls of the carrier.

DETAILED SPECIFICATION

Figure 1:
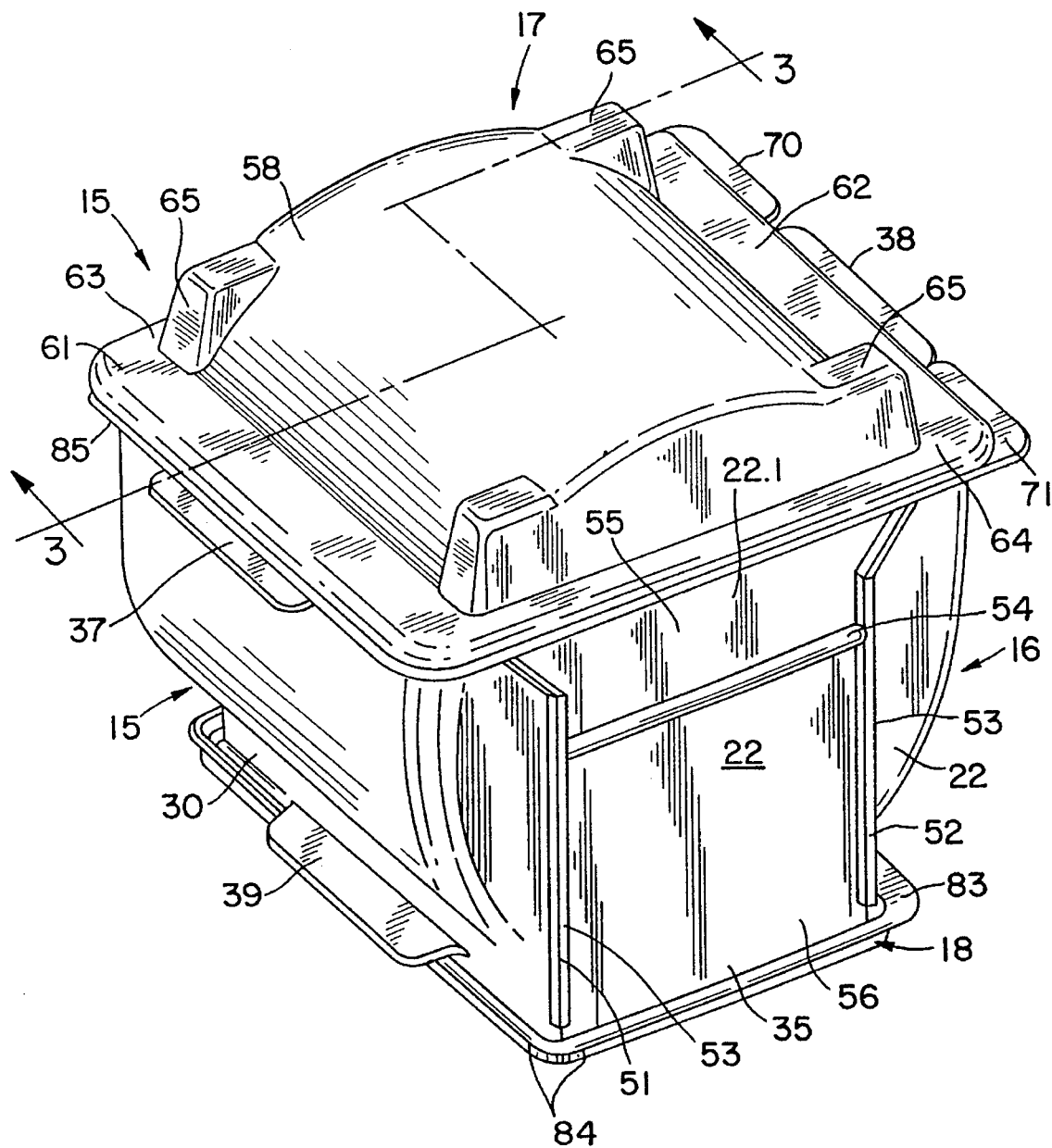
FIG. 1 is a perspective view of a plastic shipping container.

The shipping container is indicated in general by numeral 15 and comprises a wafer carrier 16, a top cover 17 and a bottom cover 18.

The wafer carrier 16 is preferably molded of a substantially rigid and transparent plastic material, such as polycarbonate, although the wafer carrier might be molded of other comparable or equivalent plastics. The top cover 17 and bottom cover 18 are both molded of a substantially stiff but resiliently and flexibly yieldable plastic material, such as a thermoplastic elastomer known by its trademark Hytrel®, a registered trademark of DuPont. The bottom cover 18 forms a bottom wall of container 15. The Hytrel thermoplastic elastomer, in all of its grades, are block copolymers, consisting of a hard (crystalline) segment of polybutylene terephthalate and a soft (amorphous) segment based on long-chain polyether glycols. The particular material used in the top and bottom covers 17 and 18 has a hardness, durometer D in the range of 45 to 55 to 63, and the material is elastic and has a sticky tack at the surface, providing for maximum grip and minimum creep of material and a high abrasion resistance. In addition, the stiff but resiliently yieldable material in the top and bottom covers resists deterioration from many industrial chemicals, oils and solvents.

The wafer carrier 16 comprises four encompassing walls specifically identified as sidewalls 19 and 20 and end walls 21 and 22. The sidewalls 19 and 20 and end walls 21 and 22 are molded integrally of each other so that the plastic wafer carrier 15 is in one piece. The upper edge portions 19.1, 20.1, 21.1 and 22.1 of the sidewalls and end walls are in substantially linear relation to each other with respect to each other, lying in a plane and defining the top opening 23 of the carrier facilitating loading the wafers W into the wafer carrier and unloading the wafers from the wafer carrier.

The sidewalls 19 and 20 have a multiplicity of upright ribs or teeth 24 and 25 formed integrally thereof and defining pockets or slots 25.1 therebetween for receiving and retaining the semiconductor wafers W in spaced relation with each other. The transparent polycarbonate of the sidewalls 19, 20 facilitate viewing the wafers to determine their presence and location. The sidewalls 19 and 20 also have rounded offset portions 26 and 27 shaped to conform generally to the shape of the wafers W to be carried therein. The offset portions have additional wafer separating lugs 28 and 29 for maintaining the wafers W in spaced relation to each other and in quiet relation with respect to each other.

The sidewalls 19 and 20 also have depending and parallel foot panels 30 and 31 defining the lower edge portions 32 and 33 of the sidewalls 19 and 20, respectively.

End walls 21 and 22 are both substantially flat or planar and have lower edge portions 34 and 35 which are arranged generally in the same plane as the lower edge portions 32 and 33 of the sidewalls 19 and 20. The interconnected lower edge portions 32, 33, 34 and 35 of the sidewalls and end walls cooperate to define the bottom opening 36 of the carrier between the foot panels 30 and 31 in order to provide access to the wafers W at the bottom of the carrier 16.

The sidewalls 19 and 20 have outwardly protruding tabs 37 and 38 molded integrally of the upper edge portions 19.1 and 20.1 of the sidewalls, and the tabs 37 are elongate and extend longitudinally along the sidewalls, substantially midway between the ends of the sidewalls, substantially as illustrated in FIG. 1. Sidewall 19 has lower tab 39 and sidewall 20 has a lower tab (not shown). These lower tabs protrude outwardly from the lower edge portions 32 and 33 of the sidewalls and specifically from foot panels 30 and 31 thereof. The lower tab on sidewall 20 is a mirror image of tab 39 on sidewall 19.

The upper edge portions 19.1, 20.1 of the sidewalls and the upper edge portions 21.1, 22.1 of the end walls define enlarged and outwardly flared upper rim portions 41, 42 on the sidewalls 19, 20 and rim portions 43, 44 on the end walls 21, 22, respectively. The enlarged upper rim portions 41–44 connect with each other and accordingly provide rim portions extending around the entire periphery of the carrier 16, i.e. along both sidewalls and end walls. The peripherally extending rim portions 41–44 lie substantially in a plane.

The sidewalls 19 and 20 and the end walls 21 and 22 also define enlarged and outwardly flaring lower rim portions 45, 46, 47 and 48, respectively, which join together and effectively provide lower rim portions around the entire periphery of the carrier 16. The lower rim portions lie substantially in a plane.

Figure 2:
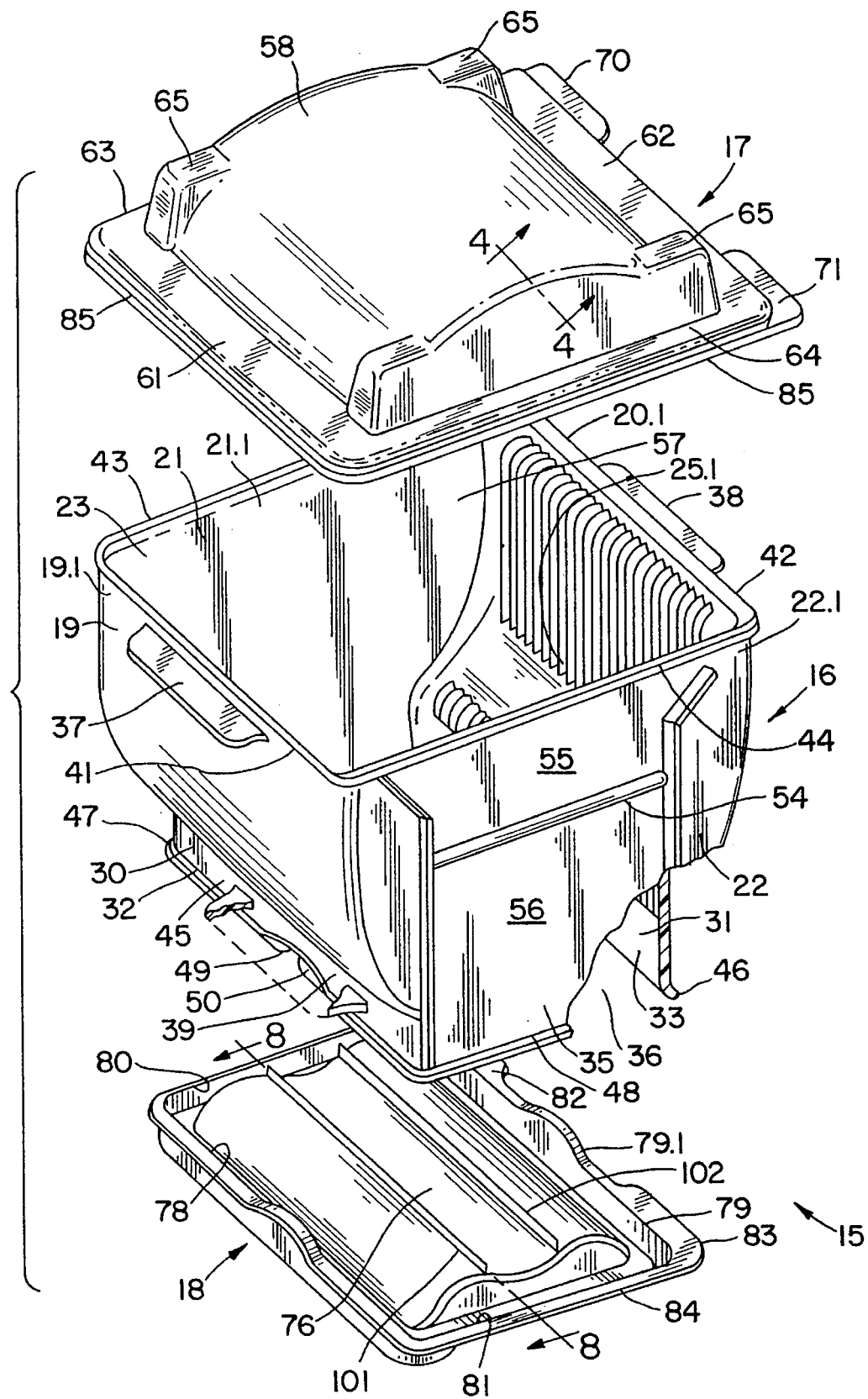
FIG. 2 is a perspective view of the shipping container in exploded condition to show the three principal parts.
Figure 3:
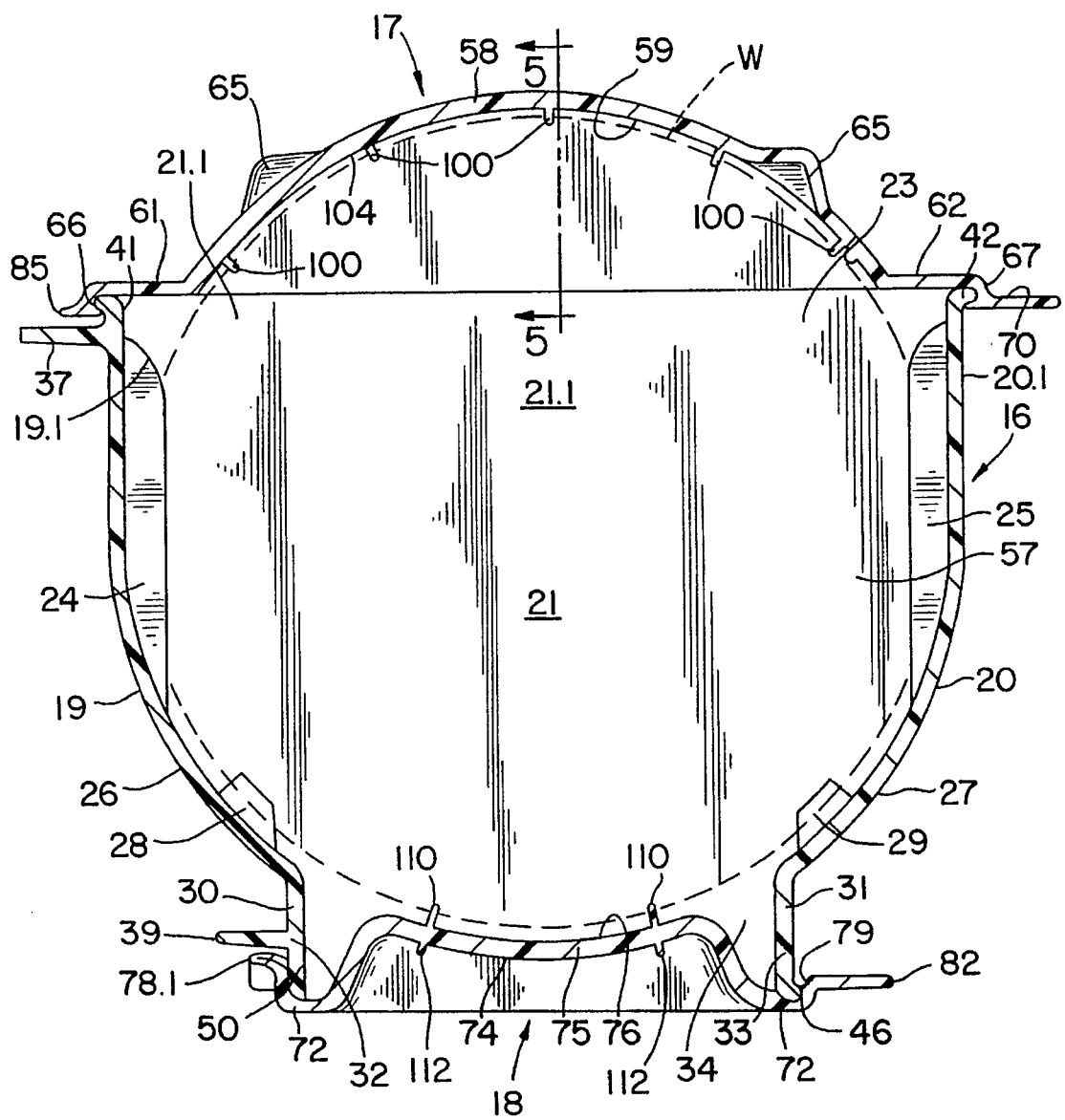
FIG. 3 is a section view through the shipping container, taken on a broken line as indicated at 3—3 in FIG. 1, and wherein the break is taken at the center line indicated by dot-dash lines in FIG. 3 particularly indicating the tabs and elevation.
Figure 4:
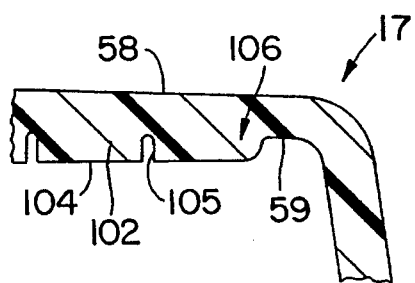
FIG. 4 is an enlarged detail section view taken at approximately 4—4 of FIG. 2.

Each of the foot panels 30 and 31 has an indexing notch 49 formed therein to cooperate with indexing ribs or media in a processing machine for accurately locating the wafer carrier 16 in such a processing machine. The two lower rim portions 45 and 46 on the foot panels 30 and 31 of the sidewalls 19 and 20 diverge upwardly as at 50 and pass over the indexing notch 49. The shape of portion 50 illustrated in FIG. 2 may be defined by an arc passing over indexing notch 49 and extending almost the entire length of lower rim portions 45 and 46.

It is to be particularly recognized that all portions of the end walls 21 and 22 are of substantially uniform height, and of the same height as the sidewalls 19 and 20. The end wall 22 has a pair of widely spaced support bars 51 and 52 formed integrally thereof and extending into close proximity with the upper and lower edge portions 22.1 and 35, respectively, of the end wall 22. The support bars 51 have coplanar outer edges 53 to lie on a plane surface of a processing machine for the purpose of accurately locating the wafer carrier and the wafers relative to other equipment in the processing machine. The end wall 22 also has an indexing crossbar 54 formed integrally thereof, and is sometimes referred to as an "H-bar", extending transversely of the support bars 51, 52. The indexing crossbar 54 accurate locates the wafer carrier 16 in a processing machine by cooperating with the locating mechanism thereof. While the crossbar 54 is shown to extend entirely to the support bars 51, 52, but may extend only partially across the end wall 22 between the support bars. The crossbar 54 is also formed integrally and in one piece with the end wall 22.

It is to be particularly noted that both end walls 21 and 22 have the full height which is the same as the height of the sidewalls 19, 20; and the end walls 21 and 22, as well as the sidewalls, have the enlarged upper and lower rim portions which effectively extend around the entire periphery of the carrier 16. The end wall 22 in particular has panel portions 55 and 56, which respectively extend upwardly from the indexing crossbar 54 to the enlarged upper rim portion 44, and downwardly from the indexing crossbar 54 to the enlarged lower rim portion 48, respectively. Both of the panel portions 55 and 56 fill the entire spaces between the support bars 51, 52, which are formed integrally of the end wall 22.

Both the top cover 17 and the bottom cover 18, when applied to the upper and lower portions of the carrier to respectively close the top opening 23 and bottom opening 36 thereof, establish a substantially hermetic sealing relations with respect to the carrier to essentially prevent migration of air, moisture and contaminating particles either into or out of the open interior 57 of the carrier wherein the wafers W are stored. In addition, because both the top cover 17 and bottom cover 18 are formed or molded of a substantially stiff, but resiliently flexibly yieldable plastic material, these top and bottom covers 17, 18 may be flexed slightly during removal thereof so as to essentially peel the covers off the carrier by initially lifting one corner of the cover off the carrier and then progressively disengaging the remainder of the cover from the carrier.

The top cover 17 comprises a partially cylindrical panel or retainer portion 58 having the curvature substantially the same as the shape of the edges of the wafers W to be stored in the container 15. In one successful example of the container, the wafers may have a diameter of approximate eight inches (20.3 cm) and the curvature of the panel 58 appropriately substantially duplicates the curvature of the edge of panels of such size. The container 15 is also suited to store 6 inch (15 cm), twelve inch (30 cm) or larger wafers by making the container an appropriate size. The partially cylindrical panel 58 has a convex inner surface facing the open interior 57 of the wafer carrier.

The top cover 17 also has substantially flat and planar side edge portions 61, 62, 63, 64. It will be recognized that the side edge portions 61, 62, adjacent the carrier sidewalls 19 and 20, provide springiness in the cover, and are substantially wider than the end edge portions 63, 64 which are adjacent the end walls 21, 22 of the carrier. The side edge portions 61–64 lie directly on the upper edge portions 19.1, 20.1, 21.1. and 22.1 of the carrier and contribute to maintaining the substantially hermetic seal between the carrier and the top cover.

Figure 5:
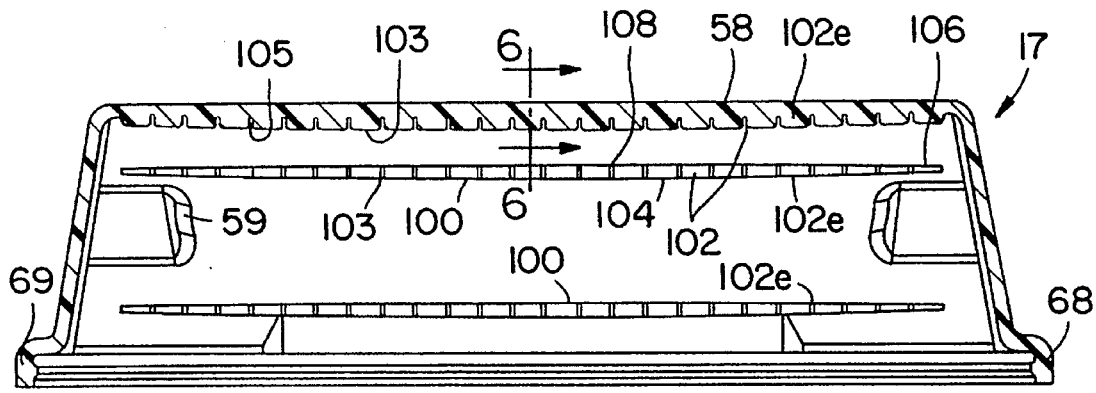
FIG. 5 is a section view taken at approximately 5—5 of FIG. 3.

Panel 58 also has a plurality of rows 100 of resiliently flexible tabs 102 extending longitudinally along the partially cylindrical inner surface. As illustrated in FIG. 5, the rows 100 extend longitudinally along the cover 17 and of the panel 58 so as to overlie and engage each of the wafers with a wafer-engaging edge 104. The rows 100 are spaced from each other. A center row is mounted centrally of the top cover. The spacing of the rows accommodate the flats of the wafers W. Each of the rows of tabs 100 has two end portions 106 and a middle portion 108. Each row is substantially linear and attached to panel 58 along surface 59. The outer edge of each row is generally indicated by numeral 103 and its shape is defined by the wafer-engaging edges 104 of adjacent tabs 102.

Figure 7:
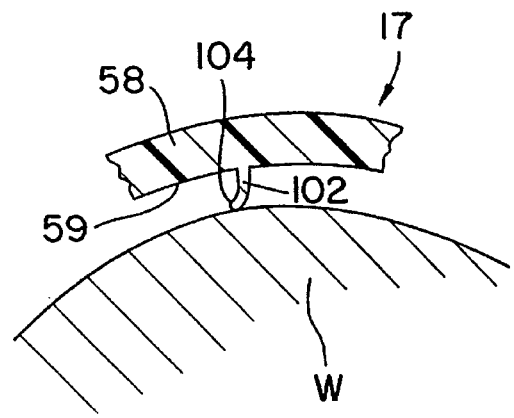
FIG. 7 is an enlarged detail section view taken at approximately 6—6 of FIG. 5 showing the tab engaging a wafer.

Each tab 102 protrudes slightly toward the open interior 57 of the carrier to engage the edge of a wafer W and maintain a spaced relation between the edge of the wafer panel 58 (see FIG. 7). It should be understood, as illustrated in FIG. 7, the tabs are resiliently flexible and will bend or crush upon engagement with the wafer W. Tab 102 will retain contact to cushion the wafer W during shipment and storage.

The tabs 102 are generally rectangular and have a width extending into the container 57. Each tab 102 has a length extending along the row 100 and is separated from adjacent tabs 102 by a slot 105. The length of each tab 102 along the row 100 is defined by the slot 105 and calibrated to allow each tab 102 to engage a single wafer W with the wafer-engaging edge 104. The slot 105 allows each tab 102 to engage a wafer W independently of adjacent tabs 102. The wafer-engaging edge 104 is spaced from the cover 58 to engage and cushion wafers W that may be stored in container 15.

As illustrated in FIG. 5, the width of the tabs 102 measured from the panel 58 progressively increases and decreases along row 100. Tabs 102 in the middle portion 108 are wider than tabs 102 located in the end portion 106. As shown in FIG. 5, tabs 102 and the tabs in the middle portion of the row 108 are approximately 0.100 inches wide. Tabs 102 located at the end portion 106 are approximately 0.50 inches. These measurements are intended to illustrate the relative width of tabs along the middle 108 and end 106 portions of the row, they are not meant to limit the scope of the invention. Tabs 102 located along the middle portion of the row 108 are wider to allow the cover 17 to flex and bow from the weight of wafers in the container 15 and the restraining force of the tabs 102 pressing against the wafers W. The wider tabs 102 located in the middle portion of the row 108 allows the cover 17 to flex while maintaining contact with each wafer W by a independent wafer engaging edge 104. Under some conditions, it may be necessary for the width of tab 102 to increase in a nonlinear fashion along the row 100.

The shape of the outer edge 103 of each row 100 of tabs is very important to maintaining contact with each wafer W. The wafer engaging edge 104 of adjacent tabs 102 along a row cumulatively defines an arcuate shape along the outer edge 103 of each row 100. Each tab 102 is separated from adjacent tabs along the row 100 by a slot 105. The slots 105 and wafer engaging edges 104 of adjacent tabs define a discontinuous arcuate shaped outer edge 104 along each row 100. The cumulative effect of the widths of each tab 102 progressively increasing from the end portion 106 to the middle portion 108 is an arcuate or curved shape along the outer edge 103.

Figure 6:
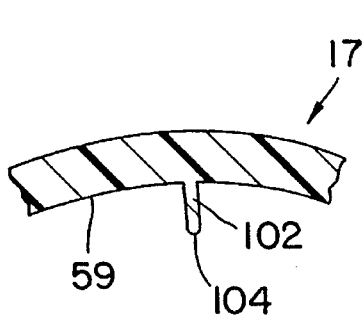
FIG. 6 is an enlarged detail section view taken at approximately at 6—6 of FIG. 5.

The plurality of rows 100 may be distributed across the top cover 17 along the panel 58. A single row 100 may be centered along panel 58 between the side walls 19 and 20. Rows of tabs 100 may also be displaced between the center row 100 and the side portions 61, 62 of the top cover 17. As illustrated in FIG. 6 and 7, tabs 102 are integrally molded with the cover 17 to minimize manufacturing costs.

As illustrated in FIG. 5, a set of corresponding tabs are labeled 102e for reference. Each set of corresponding tabs 102e will engage and cushion a particular wafer W. The relative width of the tabs 102 in each of the respective rows 100 may vary from row to row to accommodate different shape covers 17 and different amounts of flex in the cover 17. A row 100 centered along panel 58 may have tabs which are shorter than the corresponding tabs of rows 100 displaced between the center row and the side portions 61, 62.

The top cover 17 also has a multiplicity of deformations or stacking offsets 65 formed in the panel 58 to facilitate stacking of the containers one upon another.

The top cover 17 also has enlarged top cover rim portions extending around the entire periphery of the top cover and more specifically, the top cover has inwardly protruding enlarged top cover rim portions 66, 67 extending along the side edge portions 61, 62 of the top cover; and has enlarged top cover rim portions 68, 69 extending along the end edge portions 63, 64. When the top cover 17 is applied onto the carrier 16, the rim portions 66–69 engage and embrace the rim portions 41–44 of the carrier 16 in substantially hermetic sealing relation. The rim portions 66–69 of the cover 17 and rim portions 41–44 of the carrier provide a snap fit for securing the cover 17 onto the carrier 16. The interfitting rim portions 66–69 on the cover and the rim portions 41–44 on the carrier 16 provide the sole means by which the cover 17 is anchored onto the carrier 16, i.e., there is no other latching devices for holding the cover 17 onto the carrier 16.

Cover 17 also has a pair of tab portions 70, 71 which protrude outwardly from the rim portion 67 and extend longitudinally along the rim portion 67 and side edge portion 62 adjacent the ends of the top cover to be in offset relation with respect to the adjacent tab 38 on the carrier 16. The tabs 70, 71 are useful in completing closing of the top cover 18 onto the carrier 16. In the final stages of applying the too cover, the tabs 70, 71 may be manually squeezed toward the tab 38 on the carrier to assure that application of the bottom cover is completed, and that the snap fit has been finished. Top cover 17 may also have symmetrically located tabs on rim portion 66.

Although technicians using the container 16 may devise various procedures of applying and removing the top cover 17, it has been found to be successful to first place the top cover 17 upon the upper edge portions of the side and end walls. The two corners of the top cover may be pressed, initially, onto the rim portions of the side and end walls using the palm or heel of the person's hands. Then the side edge portions 61, 62 of the top cover are progressively pressed onto the rim portions 41, 42 at the sidewalls of the carrier, until the entire rim portions 66–69 of the cover have achieved and completed the snap fit onto the adjacent rim portions 41–44 of the carrier.

For removing the top cover 17, a corner portion, such as adjacent rim portions 67 and 69, are lifted off the adjacent rim portions 42, 44 of the carrier, and the corner portion of the top cover is flexed upwardly. The rim portions are progressively separated by lifting on the top cover until the cover is free of all of the rim portions 41–44 of the carrier.

The particular materials from which the carrier 16 and cover 17 are formed are highly resistant to abrading and scuffing and accordingly, the generation of particulate is minimized as the cover is lifted off or applied onto the carrier.

The bottom cover 18 has side edge portions 72 and end edge portions 73 which respectively underlie the lower edge portions 32, 33 and 34, 35 of the carrier and engage the lower edge portions of the end walls and sidewalls of the carrier to contribute materially to a substantially hermetic sealing relation between the bottom cover 18 and the carrier 16. The bottom cover 18 also has a plurality of rows 110 of resiliently flexible tabs 117 on the bottom cylindrical panel 75. Tabs 117 are substantially similar to tabs 102 in the top cover. In addition, rows 110 are substantially similar to rows 104 in the top cover. Rows 110 extend longitudinally of bottom cover 18 and are spaced from each other to accommodate flats of wafers W. Each row has two end portions 116 and a middle portion 118. Each row 110 is substantially linear and attached to the inner surface 76. The rows 110 have an outer edge indicated in general by the number 111. The shape of the outer edge 111 is defined by the wafer-engaging edge 114 of adjacent tabs 117. The tabs 117 are substantially rectangular and have a width extending into the container 57 and a length extending along the row 110.

Figure 8:
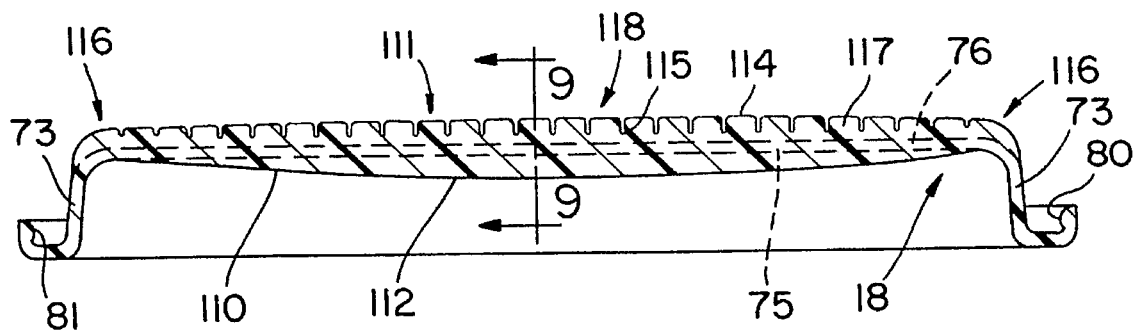
FIG. 8 is a section view taken at approximately 8—8 of FIG. 2.

The wafer-engaging edge portions 114 are spaced from the partially cylindrical panels 75 to engage and cushion the wafers W. The rows in the bottom cover 110 have two end portions indicated in general by the numeral 116 and a middle portion indicated in general by the numeral 118. The width of the tabs 117 progressively increases and decreases along the row. As illustrated in FIG. 8, the width of the tabs 117 are wider in the middle portion of the row 116 than at the end portion of the row 118. The width of tabs 117 is wider in the middle portion of the row 118 than at the end portion of each row 116 to allow wafer-engaging edge 114 to engage and apply a retaining force against each wafer W. Row 110 on bottom cover 18 and row 100 in the top cover 17 suspend the wafers W in the container 15 between tabs 102 and 117 during shipment and storage while equally distributing the retaining force across all the wafers W and allowing for bowing or flexing of either or both covers 17, 18.

Figure 9:
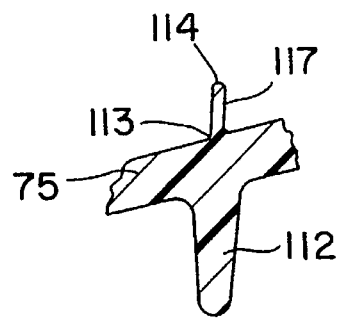
FIG. 9 is an enlarged detail section view taken at approximately 9—9 of FIG. 8.

Adjacent tabs 117 are separated from each other by a slot 115. The slot 115 defines the length of the tab 117 and of the wafer-engaging edge 114. Each tab 117 is located along the row 110 to engage and support a single wafer W which may be stored in the container. As the bottom cover 18 is applied to the carrier 16, the wafer engaging edge 114 of each tab 117 will engage a single wafer W and lift it from its resting position along the sidewalls 19 and 20. As illustrated in FIGS. 8 and 9, tabs 117 are integrally molded with the cover 17 to minimize manufacturing costs.

The bottom cover 18 also has a plurality of supporting ribs 112 on outside panel 75. These support ribs 112 extend downwardly from the bottom cover 18 and outwardly from the container 15. Each supporting rib 112 is parallel to a row 110 on bottom cover 18. This rib strengthens the bottom cover 18 to reduce bowing or flexing when wafers W are inserted into the container 15 and engaged with the tabs 117 along the row 110.

The bottom cover also has rim portions extending around the entire periphery of the bottom cover and more specifically, the bottom cover comprises enlarged rim portions 78, 79 extending along the side edge portions 72 of the bottom cover and embracing the rim portions 45, 46 of the sidewalls 19, 20 of the carrier. The bottom cover also enlarged bottom cover rim portions 80, 81 extending along the end edge portions 73 of the bottom cover and embracing the enlarged rim portions 47, 48 of the end walls of the carrier 16. The rim portions 78, 79, 80 and 81 lie substantially in a plane and embrace the rim portions 45, 46, 47 and 48 of the wafer carrier in a snap fit and in a substantially hermetic sealing relation to retain the bottom cover on the wafer carrier. The rim portions 78–81 of the bottom cover and the rim portions 45–48 of the wafer carrier comprise the sole means by which the bottom cover is retained on the wafer carrier, i.e., there need be no supplemental latching means for holding the bottom cover on the carrier.

The substantially hermetic seal between the carrier 16 and the top and bottom covers 17, 18 prevents movement of air, other gases, moisture and particles into and out of the container 15, and prevents the carrier from burping or sucking as atmospheric pressures change.

The bottom cover 18 also has a pair of elongate tab portions 82, 83 extending longitudinally along one of the side edge portions 72 and adjacent the rim portion 79 of the bottom cover. The tab portions 82, 83 lie adjacent, but in offset relation, with respect to the adjacent tab 40 on the lower side edge portion of the wafer carrier so as to facilitate a person simultaneously engaging and squeezing both of the tab portions 83 and 40 and assuring that the snap fit has been completed in applying the bottom cover onto the carrier. Ordinarily the bottom cover 18 is applied to the carrier by laying the bottom cover 18 on a support table, then the carrier 16 is placed upon the bottom cover and pressed so as to secure the carrier 16 and cover 18 together in a snap fit. If the wafers W are already in the carrier, the wafers will be lifted by the bottom cover 18 off the offset portions 26, 27 of the sidewalls 19, 20. Bottom cover 18 may also have a pair of symmetrically located tabs on the side edge portion 72 opposite tab portion 82 and 83.

In removing the bottom cover 18 from the wafer carrier, one corner portion of the bottom cover is flexed, as above described in connection with the top cover, and the bottom cover 18 may thereby be progressively disengaged from the enlarged lower rim portions 45–48 of the wafer carrier for removing the bottom cover. The rim portions 78–81 of the bottom cover engage and embrace the rim portions 45–48 of the wafer carrier and establish a substantially hermetic sealing relation between the bottom cover 18 and the wafer carrier to prevent migration of air, moisture and particulate into or out of the interior 57 of the wafer carrier. Whereas the bottom cover rim portions 78–81 lie substantially in a plane, portions 78.1, 79.1 of the rim portions 78, 79 extending along the side edge portions 72 of the bottom cover, are diverted out of the plane of the remainder of the bottom cover rim portions to conform to the shape of the portions 50 of the rim portions 45, 46 which diverge out of the planes of the rim portions on the wafer carrier and pass over the index notches 49 in the foot panels 30, 31 of the wafer carrier.

The bottom cover 18 also has outwardly protruding lip portions 84 protruding outwardly all around the periphery of the bottom cover except at the tabs 82, 83 to add strength to the bottom cover. Similarly, the top cover 17 has outwardly protruding lip portions 85 protruding outwardly from the edge portions of the top cover all the way around the periphery of the top cover except at the tabs 70, 71 to provide additional strength to the top cover.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A device for storing and shipping semiconductor wafers and disks comprising:

(a) a container having side, end and bottom walls, an open top and an elongate removable cover to provide access into the interior chamber wherein such wafers are received and stored, the container having wafer separating means maintaining the wafers in a spaced and confronting relationship to each other and transversely oriented of the side walls, the cover having a latching means to secure the cover to the container thereby to confine and protect the wafers; and (b) a plurality of rows of resiliently flexible tabs on the cover, the rows extending along the cover and spaced from each other, each row having two end portions and a middle portion, the tabs being generally rectangular and having a wafer engaging edge portions, each row having an outer edge defined by the wafer engaging edge portions of adjacent tabs, the tabs having a length extending along the row and a width transverse the length, the wafer engaging edge portion being spaced from the cover to engage and cushion the wafers, a slot separating adjacent tabs, each tab positioned along the row to engage a single wafer with a corresponding tab in each other row and apply a retaining force, the width of the tabs progressively increasing from the end portions of each row to the middle portion of the row to thereby cushion the wafers in the container and balance the retaining force across each of the wafers while accommodating bowing or flexing of the cover.

2. The invention of claim 1, wherein the rows of wafer cushioning tabs are integrally molded to the cover.

3. The invention of claim 1, wherein the width of the tabs is shorter at the end portions than in the middle portion.

4. The invention of claim 1, wherein the width of the tabs is shorter at the end portions than in the middle portion, the tabs increasing in width nonlinearly along the row.

5. The invention of claim 1, wherein the outer edge of each row of tabs forms an arcuate shape.

6. The invention of claim 1, wherein a center row is positioned centrally of the cover between the side walls.

7. The invention of claim 6, wherein the tabs of the center row are shorter than corresponding tabs of another rows.

8. The invention of claim 1 wherein the container has a plurality of rows of resiliently flexible tabs on the bottom wall, the rows extending a long the bottom wall and spaced from each other, each row having two end portions and a middle portion, the tabs being substantially rectangular and having a wafer engaging edge portions, each row having an outer edge defined by the wafer engaging edge portions of adjacent tabs, the tabs having a length extending along the row and a width transverse the length, the wafer engaging edge portion being spaced from the bottom wall to engage and cushion the wafers, a slot separating adjacent tabs, each tab positioned along the row to engage a single wafer and apply a retaining force, the width of the tabs progressively increasing from the end portions of each row to the middle portion of the row to thereby suspend the each wafer in the container between rows in the cover and rows in the bottom wall and balance the retaining force across each of the wafers while accommodating bowing or flexing of the cover and bottom wall.

9. The invention of claim 1, wherein the bottom wall has a plurality of support ribs affixed to the bottom wall extending downwardly from the bottom wall and outwardly from the container, each rib being parallel to a row of tabs in the bottom wall thereby to strengthen the bottom wall and reduce the bowing or flexing of the bottom wall.

10. The invention of claim 1 wherein the bottom wall is removable.

11. A device for storing and shipping semiconductor wafers and disks comprising:

(a) an elongate container having side walls, end walls, an open top and an open bottom, a removable elongate bottom cover and a removable elongate top cover to provide access into the interior chamber wherein such wafers are received and stored, the container having means separating the wafers to maintain the wafers in a spaced and confronting relationship to each other and transversely oriented of the side walls, the container having means latching the top and bottom covers to the container, the top and bottom covers having means latching to the container thereby to confine and protect the wafers; and (b) a plurality of rows of resiliently flexible tabs on the top cover, the rows extending longitudinally of the top cover and spaced from each other, each row having two end portions and a middle portion, the tabs being substantially rectangular and having wafer engaging edge portions, each row having an outer edge defined by the wafer engaging edge portions of adjacent tabs, the tabs having a length extending along the row and a width transverse the length, the wafer engaging edge portion being spaced from the top cover to engage and cushion the wafers, a slot separating adjacent tabs, each tab positioned along the row to engage a single wafer with a corresponding tab in each row and apply a retaining force, the width of the tabs progressively increasing from the end portions of each row to the middle portion of the row to thereby cushion the wafers in the container and balance the retaining force across each of the wafers while accommodating bowing or flexing of the device.

12. The invention of claim 11, wherein the width of the tabs is shorter at the end portions than in the middle portion.

13. The invention of claim 11, wherein the width of the tabs is shorter at the end portions than in the middle portion, the tabs increasing in width nonlinearly along the row.

14. The invention of claim 11, wherein the outer edge of each row of tabs is an arcuate shape.

15. The invention of claim 11, wherein a center row is positioned centrally of the cover between the side walls.

16. The invention of claim 15, wherein the tabs of the center row are shorter than a corresponding tabs of another rows.

17. The invention of claim 11, wherein the container has a plurality of rows of resiliently flexible tabs on the bottom cover, the rows extending longitudinally of the bottom cover and spaced from each other, each row having two end portions and a middle portion, the tabs being substantially rectangular and having a wafer engaging edge portions, each row having an outer edge defined by the wafer engaging edge portions of adjacent tabs, the tabs having a length extending along the row and a width transverse the length, the wafer engaging edge portion being spaced from the bottom cover to engage and cushion the wafers, a slot separating adjacent tabs, each tab positioned along the row to engage a single wafer and apply a retaining force, the width of the tabs progressively increasing from the end portions of each row to the middle portion of the row to thereby suspend each wafer in the container between rows in the top and bottom covers balance the retaining force across the wafers while accommodating bowing or flexing of the top cover and bottom cover.

18. The invention of claim 16 wherein the bottom cover has a plurality of support ribs on to the bottom cover extending downwardly from the bottom cover and outwardly from the container, each rib being parallel to a row of tabs in the bottom wall thereby to strengthen the bottom cover and reduce the bowing or flexing of the bottom cover.

19. A plastic container for storing and shipping and handling semiconductor wafers and disks comprising:

(a) an elongate wafer carrier comprising sidewalls with wafer supporting offset portions and wafer separating ribs, the carrier also comprising first and second end walls interconnecting the sidewalls, the sidewalls and end walls comprising generally planar upper edge portions defining a top opening of the carrier facilitating loading and unloading of wafers, the sidewalls and end walls also defining lower edge portions defining a bottom opening of the carrier providing access to the wafers in the carrier, said upper edge portions comprising enlarged upper rim portions;

(b) an elongate bottom cover traversing the bottom opening of the wafer carrier and removably secured against said lower edge portions, the bottom cover having a plurality of supporting ribs longitudinally on the bottom wall extending downwardly from the bottom cover and outwardly from the container thereby to close the bottom opening;

(c) a plurality of rows of resiliently flexible tabs on the bottom cover, the rows extending longitudinally of the bottom cover and spaced from each other, the rows aligned parallel to the supporting ribs, each row having two end portions and a middle portion, the tabs being substantially rectangular and having a wafer engaging edge portions, each row having an outer edge defined by the wafer engaging edge portions of adjacent tabs, the tabs having a length extending along the row and a width transverse the length, the wafer engaging edge portion being spaced from the bottom cover to engage and cushion the wafers, a slot separating adjacent tabs, each tab positioned along the row to engage a single wafer with a corresponding tab in each other row and apply a retaining force, the width of the tabs progressively increasing from the end portions of each row to the middle portion of the row to form an arcuate shape along the outer edge of each row of tabs;

(d) a top cover traversing the top opening of the wafer carrier and lying removably secured against said upper edge portion of the carrier to close the top opening and retain the wafers, and a pair of spaced support bars and a transverse indexing crossbar affixed to one of said end walls, said spaced support bars extending toward said upper and lower edge portions and lying substantially in a plane; and (e) 5 rows of resiliently flexible tabs on the top cover, the rows extending longitudinally of the top cover, a center row positioned centrally of the cover and two pairs of side rows each side of the center row, each row having two end portions and a middle portion, the tabs being substantially rectangular and having a wafer engaging edge portions, each row having an outer edge defined by the wafer engaging edge portions of adjacent tabs, the tabs having a length extending along the row and a width transverse the length, the wafer engaging edge portion being spaced from the top cover to engage and cushion the wafers, a slot separating adjacent tabs, each tab positioned along the row to engage a single wafer with a corresponding tab in each other row and apply a retaining force, the width of the tabs progressively increasing from the end portions of each row to the middle portion of the row to form an arcuate shape along the outer edge of each row of tabs to thereby suspend the wafers in the container between rows in the cover and rows in the bottom wall and balance the retaining force across each of the wafers while accommodating bowing or flexing of the top cover and bottom cover.

20. The invention of claim 19, wherein the bottom cover has 2 rows of cushioning tabs spaced from each other and of the center of the bottom cover.

* * * * *

UNITED STATES PATENT AND TRADEMARK OFFICE
CERTIFICATE OF CORRECTION

PATENT NO.   : 5,586,658
DATED        : December 24, 1996
INVENTOR(S)  : David L. Nyseth It is certified that error appears in the above-indentified patent and that said Letters Patent is hereby corrected as shown below:

Column 4, line 8, delete "dose" and insert --close--.

Column 6, line 48, delete "too" and insert --top--.

Column 9, line 51, delete "a long" and insert --along--.

Signed and Sealed this

Twenty-sixth Day of August, 1997

*Attest:*

BRUCE LEHMAN

*Attesting Officer*   *Commissioner of Patents and Trademarks*